United States Patent [19]

Robe

[11] 4,151,484

[45] Apr. 24, 1979

[54] RADIATION-HARDENED TRANSISTOR AMPLIFIERS

[75] Inventor: Thomas J. Robe, Basking Ridge, N.J.

[73] Assignee: RCA Corporation, New York, N.Y.

[21] Appl. No.: 878,999

[22] Filed: Feb. 17, 1978

[51] Int. Cl.² .............................................. H03F 3/08
[52] U.S. Cl. ................................... 330/308; 307/308; 330/261; 330/296
[58] Field of Search ................ 307/308; 330/261, 296, 330/308

[56] References Cited

U.S. PATENT DOCUMENTS 3,743,955  7/1973  Stehlin ............................. 330/308 X Primary Examiner—Lawrence J. Dahl
Attorney, Agent, or Firm—H. Christoffersen; A. L. Limberg; E. P. Herrmann

[57] ABSTRACT

An amplifier transistor has its base-to-collector voltage maintained substantially zero, and its collector-base junction has in inverse-parallel connection therewith an auxiliary semiconductor junction exposed to the same transient ionizing radiation environment. Photo-currents generated in the collector-base junction of the amplifier transistor responsive to transient ionizing radiation are counteracted by the photo-currents concurrently generated in the auxiliary semiconductor junction, so amplification can continue without being unduly hampered by such radiation.

5 Claims, 4 Drawing Figures

RADIATION-HARDENED TRANSISTOR AMPLIFIERS

The present invention relates to circuitry for compensating for transient photo-currents generated in a transistor responsive to transient ionizing (e.g., gamma) radiation, which circuitry is particularly well-suited for monolithic integration.

J. W. Crowe in U.S. Pat. No. 3,409,839, issued Nov. 5, 1968, and entitled "Method and Apparatus for Minimizing the Effects of Ionizing Radiation on Semiconductor Circuits" describes the generation of photocurrent flow in the collector-base junction of an amplifier transistor, which current flows in the direction of difficult conduction, tending to increase charge on the base-emitter junction to the amplifier transistor, increasing its emitter-to-base potential and consequently its collector current flow. To forestall this increase in emitter-to-base potential and thus prevent transient disturbances in collector current flow caused by ionizing radiation, as might interfere with the transistor operating as an amplifier, Crowe applies a neutralizing charge to the base electrode of the amplifier transistor from the collector electrode of a transistor with no connection to its emitter electrode, which open-emitter transistor is exposed to the same ionizing radiation as the amplifier transistor. Crowe mentions that the base potential of the open-emitter transistor can be adjusted to an optimum value to further improve the cancellation of the charge variations generated in the collector-to-base junctions of the amplifier and open-emitter transistors if desired. Also of interest is the teaching of R. A. Stehlin and H. W. Spence with regard to differential transistor amplifiers which are generally insensitive to the presence of radiation fields, found in U.S. Pat. No. 3,716,727 issued Feb. 13, 1973, and entitled "Switched Amplification System Having Radiation Compensation Circuitry."

Certain operational amplifiers use a pair of input transistors in long-tailed-pair configuration, each connected in cascode configuration with a respective subsequent common-base amplifier transistor, the base electrodes of the common-base amplifier transistors being biased to maintain substantially zero base-to-collector voltages on the input transistors. This may be done (a) to secure the advantages commonly associated with cascode operation; (b) to eliminate leakage current flow across the collector-base junctions of the input transistors that would tend to introduce differential offset errors into the input voltages of the transistors and/or (c) to permit the use of super-beta input transistors without risk of punchthrough. The reader is referred to "Op-amp IC's with Super-Gain Transistors" appearing in the Progress in Design and Research section, pages 19–24, of November 1969 EEE and U.S. Pat. Nos. 3,482,177; 3,614,645; 3,938,055; and 4,007,427.

The present inventor has found the auxiliary semiconductor junction in inverse parallel connection with the collector-base junction of a transistors, will, if the potential across the inverse-parallel connection is maintained substantially zero, permit the transistor to operate unhampered due to the generation of photo-currents in its collector-base junction responsive to the transient ionizing radiation impingent upon both the collector-base junction of the transistor and the auxiliary semiconductor junction. This inverse-parallel connection of a junction is, in effect, a loop connection for the photo-currents, so they do not flow in substantial amount in the rest of the circuitry associated with the transistor. This new arrangement is particularly attractive and advantageous where the base-to-collector voltage of the transistor is maintained substantially zero anyway for other reasons of circuit operation.

Figure 1:
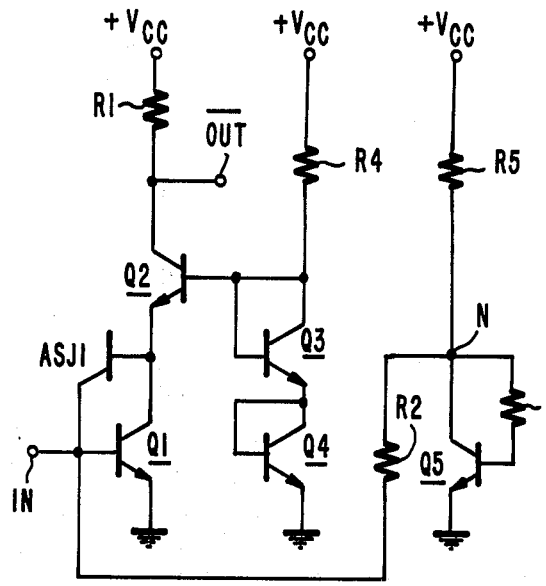
FIG. 1 is a schematic diagram of a cascode amplifier embodying the invention, the common-emitter amplifier transistor Q1 of which has its base-to-collector voltage regulated to zero volts and has an auxiliary semiconductor junction ASJ1 in inverse-parallel connection with its collector-base junction to counteract generation of photo-currents due to transient ionizing radiation.

In FIG. 1 transistors Q1 and Q2 are the common-emitter-amplifier and common-base-amplifier portions of a cascode configuration having an input signal terminal IN at the base of Q1, having an output signal terminal OUT at the collector of Q2, and having a resistive element R1 as a load. Common-base amplifier transistor Q2 has its base electrode biased two emitter-to-base junction offset potentials ($2V_{BE}$'s) more positive than the emitter electrode of grounded-emitter transistor Q1. In FIG. 1 this is done by applying forward-bias current via resistive element R4 to the series connection of two self-biased transistors Q3 and Q4 to develop a $2V_{BE}$ potential across the series connection and between the emitter of Q1 and base of Q2.

Q1 is conditioned for a prescribed quiescent collector-to-emitter current flow, which current is drawn through the emitter-base junction of Q2. This current flow conditions Q2 to exhibit a $1V_{BE}$ potential offset across its emitter-base junction. Since the base of Q2 is at $+2V_{BE}$ potential, its emitter is placed at $+1V_{BE}$ potential, both potentials being measured respective to the emitter potential (shown as ground in FIG. 1) of Q1. The quiescent emitter-to-base potential of Q1 has to be held at a $+1V_{BE}$ value to support its prescribed quiescent collector-to-emitter flow. This means the collector and base potentials of Q1 are each $+1V_{BE}$ more positive than its emitter potential.

An auxiliary semiconductor junction ASJ1, resembling the collector-base junction of Q1 in profile and in area is in inverse-parallel connection with that collector-base junction. The normal junction diode symbol is not employed with regard to ASJ1, but rather a transistor symbol with the emitter portion omitted, this because of the resemblance of the structure to the collector-base junction of a transistor. ASJ1 may be constructed as a transistor of like conductivity to Q1, with an emitter region and an emitter electrode, which is either unconnected or reverse-biased; but current practice is to omit these as superfluities.

ASJ1 will, like the collector-base junction of Q1, have substantially zero quiescent potential thereacross. ASJ1 and the collector-base junction of Q1 are arranged in sufficient proximity to each other that they are subject to similar transient ionizing radiation and will have similar amplitude photo-currents generated in them during such radiation. The inverse parallel connection of these junctions provides a loop wherein these photo-currents may flow, so these photo-currents do not flow to the rest of the amplifier circuitry connected to the input signal terminal IN or through the common-base amplifier transistor Q2 to cause response at the output signal terminal $\overline{OUT}$. The zero junction potentials across ASJ1 and the collector-base junction of Q1 eliminate quiescent leakage current flows, also, which might otherwise affect the base biasing of Q1.

Q1 may be biased for prescribed quiescent collector-to-emitter current flow as shown in FIG. 1, for example. The base electrodes of Q1 and another transistor Q5 integrally constructed therewith are parallelly supplied base currents via resistive elements R2 and R3, respectively, from an interconnection N to which the collector electrode of Q5 is connected. The ratio $G_2/G_3$ of the respective conductances $G_2$ and $G_3$ of resistive elements R2 and R3 preferably is made equal to the ratio K of the collector current versus emitter-to-base voltage characteristic of Q1 to that of Q5. This is done so as not to interfere with their respective collector currents $I_{CQ1}$ and $I_{CQ5}$ being determined in accordance with their respective collector current versus emitter-to-base voltage ($I_C$ vs. $V_{BE}$) characteristics. Q5 is self-biased by the direct-coupled collector-to-base feedback connection provided by R3, adjusting the potential $V_N$ at node N to such value as to support an $I_{CQ5}$ demand that, added to the respective base currents $I_{BQ1}$ and $I_{BQ5}$ of Q1 and Q5, equals the current supplied to node N. $V_N$ will, supposing R2 and R3 to have sufficiently high conductances so the potential drops across them are negligibly small, be around a $1V_{BE}$ value. Since $V_{BE}$ varies logarithmically with transistor collector current, having a value that ranges from 550 to 700 millivolts for a silicon transistor, the current supplied to node N via a resistive current path from $+V_{CC}$ can be readily determined by Ohm's Law.

Where this path is through a resistive element R5, as shown in FIG. 1, this current and therefore $I_{CQ5}$ will have values substantially equal to $(+V_{CC}-V_{BE})/R_5$, where $R_5$ is the resistance of R5. $I_{CQ1}$ is, of course, equal to $I_{CQ5}$ multiplied by K, the ratio of the $I_C$ versus $V_{BE}$ characteristic of Q1 to that of Q5, owing to Q1 and Q5 having similar emitter-to-base voltages. So the terminal $\overline{OUT}$ will have a quiescent potential substantially equal to $V_{CC}-(KR_1/R_5)(V_{CC}-V_{BE})$ in FIG. 1, where $R_1$ is the resistance of R1. Photo-current generated in the collector-base junction of Q2 responsive to transient ionizing radiation flows unamplified through load R1, generating a response at terminal $\overline{OUT}$. This contrasts with a portion of the photo-current generated in the collector-base junction of Q1, is ASJ1 were omitted, being amplified by the common emitter forward current gain $h_{feQ1}$ to Q1 to flow through load R1, generating a response at terminal $\overline{OUT}$ $h_{feQ1}$ times larger. Steps may be taken, of course, to compensate at least partially against the photo-currents generated in the collector-base junction of Q2 in response to transient ionizing radiation—e.g., by using prior art compensation techiques.

A variation of the FIG. 1 circuit, wherein R5 has a further forward-biased diode means (such as a self-biased transistor similar in structure to Q1 and Q5) inserted in series with R5 between $+V_{CC}$ operating potential ad node N, and wherein $R_1=R_5/2$ and $R_2=R_3$, is of particular interest in that terminal $\overline{OUT}$ is biased to a quiescent potential $(+V_{CC}/2)+V_{BE}$ despite $V_{CC}$ variations. This variation may be further modified to bias the base of Q2 from the same network used to bias the base of Q1, eliminating the need for R1, Q3 and Q4.

Figure 2:
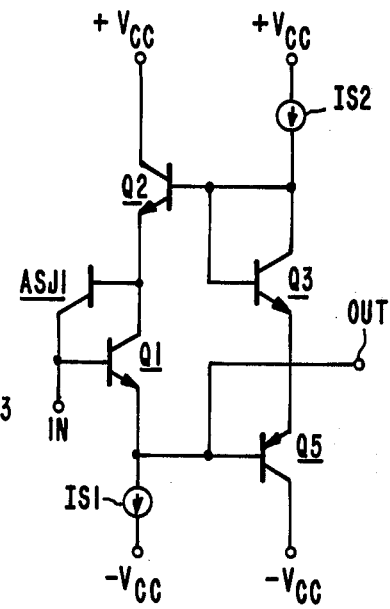
FIG. 2 is a schematic diagram of an emitter follower, radiation-hardened amplifier embodying the present invention.

FIG. 2 shows, in the context of an emitter-follower connection of Q1, how the present invention may be carried forward where the emitter electrode of Q1 is not at a fixed potential, but has an emitter current withdrawn therefrom by a current source IS1 of sufficiently high source impedance to permit emitter potential variation. Signal input and output terminals IN and OUT are at the base and emitter electrodes respectively of follower transistor Q1. Self-biased NPN transistor Q4 is replaced by emitter-follower PNP transistor Q5. Current source IS2 forward-biases the series connection of self-biased transistor Q3 and the emitter-base junction of Q5' to maintain the base of Q2 at $+2V_{BE}$ potential with respect to the emitter potential of Q1.

This arrangement may be adapted for use in a cascode arrangement of Q1 and Q2, where Q1 is provided with emitter degeneration resistance. Adaptation of this general sort is found as a subcombination in FIG. 3.

Figure 3:
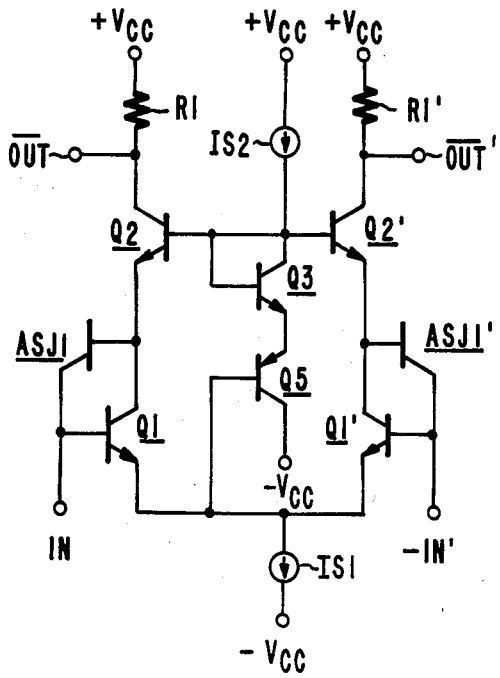
FIGS. 3 and 4 are schematic diagrams of differential input, differential-output radiation-hardened amplifiers embodying the present invention.

FIG. 3 shows a differential-input, differential-output amplifier employing a differential-amplifier connection of: (a) a first cascode amplifier connection, of transistors Q1 and Q2 and (b) a second cascode amplifier connection, similar to the first, of transistors Q1' and Q2'. The base-emitter junction of emitter-follower PNP transistors Q5' and self-biased transistor Q3, in series connection to receive forward-bias current from current source IS2, bias the base electrodes of both Q2 and Q2' to $+2V_{BE}$ potential respective to the emitter electrodes of Q1 and Q1', interconnected to have tail current drawn from them by current source IS1. Accordingly the collector-base junctions of Q1 and Q1' and the auxiliary semiconductor junctions ASJ1 and ASJ1' in respective inverse parallel connections with them have zero quiescent potentials applied across them. Photo-currents generated in the collector-base junctions of Q1 and Q1' due to transient ionizing radiation flow in respective loops with the photo-currents simultaneously generated in auxiliary semiconductor junctions ASJ1 and ASJ1'. Consequently, effects of these photocurrents do not show up at any of the input signal terminals IN, IN' or output signal terminals OUT, OUT'. The transient photo-currents generated in the collector-base junctions of common-base amplifier transistors Q2, Q2' due to transient ionizing radiation are common-mode in nature, and response to them can be suppressed in the following amplifier stage if it exhibits common-mode signal rejection.

Figure 4:
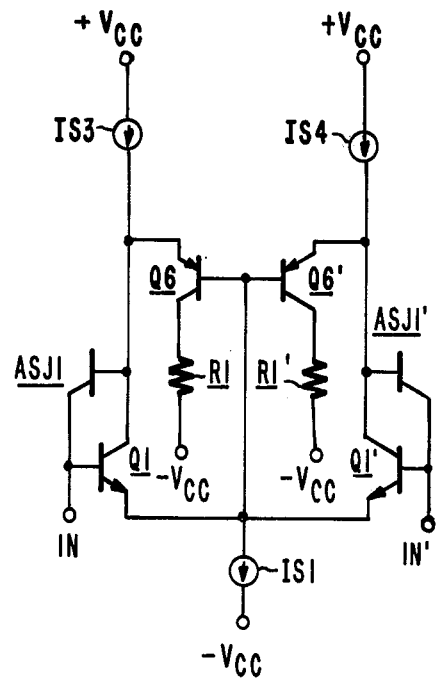

FIG. 4 shows a differential-input, differential-output amplifier employing a differential-amplifier connection of: (a) a first folded cascode amplifier connection of a common-emitter NPN transistor Q1 and a common-base PNP transistors Q6 with a current source IS3 connected to supply the collector current of Q1 and the emitter current of Q6, and (b) a second folded cascode amplifier connection of a common-emitter NPN transistor Q1' and a common-base PNP transistor Q6' with a current source IS4 connected to supply the collector current of Q1' and the emitter current of Q6'. IS3 and IS4 may simply comprise resistive elements or may be provided at the collector electrodes of the PNP transistors with fixed emitter-base biasing, for example, but should be designed to supply currents large enough to maintain the emitter-base junctions of Q6 and Q6' in forward conduction. The emitter-follower actions of transistors Q6 and Q6' then regulate their respective emitter potentials to be $+V_{BE}$ more positive than the potential at their base electrodes which are connected to the interconnection of the emitter electrodes of Q1 and Q1' at which emitter potentials 1$V_{BE}$ more negative than the quiescent base potentials of Q1 and Q1' appear. So ASJ1, ASJ1' and the collector-base junctions of Q1 and Q1' have zero quiescent potentials across them, and the cancellation of transient photo-currents generated in these junctions takes place substantially as described supra to FIGS. 1, 2 and 3.

Surprisingly, the photo-currents generated in the collector-base junctions of Q6 and Q6' responsive to transient ionizing radiation do not increase current flows in their respective collector loads R1 and R1'. Owing to the direct current conductive connection between (a) the interconnection between the base electrodes of Q6 and Q6' and (b) the interconnection between the emitter electrodes of Q1 and Q1', these photo-currents supplement the current demand of IS1 upon the interconnected emitter electrodes of Q1 and Q1', which increased demand is apportioned between the respective quiescent emitter currents of Q1 and Q1'. The collector current demands of Q1 and Q1' are increased by substantially the same amount as their emitter currents, owing to common-base amplifier action, reducing the current available from current sources IS3 and IS4 to flow as emitter currents to Q6 and Q6' respectively. The collector currents of Q6 and Q6' tend to be decreased responsive to their respective emitter currents being decreased, owing to common-base amplifier action in each transistor, thus compensating for the tendency of the collector currents of Q6 and Q6' to be increased owing to photo-currents generated by transient ionizing radiation. This technique may be extended to other differential connections of folded cascode amplifiers.

One of the primary advantages of circuits embodying the present invention is that the auxiliary semiconductor junction(s), when made by concurrent processing steps to be equal in area to the collector-base junctions, they are in inverse-parallel connection with and to be close to them physically, generate similar photocurrents responsive to a transient ionizing radiation. So the need for adjustments by a human being is eliminated.

Certain variations of the present invention will suggest themselves to one skilled in the art. For example, elements providing equal potential offsets can be introduced into the emitter connection of Q2 to ASJ1 and Q1, and the series connection of Q3 and Q4 in FIG. 1 without adversely affecting operation; and similar steps can be taken with regard to the FIG. 2 and 3 configurations. The following claims should be construed liberally, taking into account such variations when assessing the scope of the claims.

What is claimed is:
1. A radiation-hardened circuit comprising:
 a first transistor having base and emitter and collector electrodes and having a collector-base junction between its collector and base electrodes;
 a first auxiliary semiconductor junction similar in profile and area to said collector-base junction, said first auxiliary semiconductor junction being arranged with respect to the collector-base junction of said first transistor to be subject to similar transient ionizing radiation and connected in a first inverse-parallel connection with the collector-base junction of said first transistor; and
 means for maintaining the potential across each of said junctions in said first inverse-parallel connection substantially zero.

2. A radiation-hardened circuit as set forth in claim 1 wherein said means for maintaining the potential across each of said junctions in said inverse-parallel connection substantially zero includes:
 a second transistor having an emitter electrode connected to the collector electrode of said first transistor, having a collector electrode connected to a point of operating potential, and having a base electrode; and
 potential-offsetting means for maintaining a fixed offset potential connected between the emitter electrode of said first transistor and the base electrode of said second transistor.

3. A radiation-hardened circuit as set forth in claim 2 wherein said first and second transistors are of the same conductivity type, each having an emitter-base junction and being connected so their emitter-base junctions are forward-biased so as to have a quiescent offset potential thereacross, and wherein said means for maintaining a fixed offset potential between the emitter electrode of said first transistor and the base electrode of said second transistor essentially consists of means for maintaining a potential between those electrodes equal to the sum of the quiescent offset potentials across the emitter-base junctions of said first and second transistors.

4. A radiation-hardened circuit as set forth in claim 3 wherein said means for maintaining a potential between the base electrode of the second transistor and the emitter electrode of said first transistor equal to the sum of the quiescent offset potentials across the emitter-base junctions of said first and second transistors includes:
 a third transistor of a conductivity type complementary to that of said first and second transistors, said third transistor having a base electrode to which the emitter electrode of said first transistor is connected, having a collector electrode connected to an operating potential for conditioning the third transistor to operate as a common-collector amplifier, having an emitter electrode, and having an emitter-base junction between its emitter and base electrodes;
 semiconductor diode means connected between the base electrode of said second transistor and the emitter electrode of said first transistor and poled to be in series connection with the emitter base junction of said third transistor; and
 means applying current at the base electrode of said second transistor for forward biasing said semiconductor diode means and the emitter-base junction of said third transistor.

5. A radiation-hardened circuit as set forth in claim 2 having:
 third and fourth transistors alike in type to said first and second transistors respectively, each having respective emitter and collector and base electrodes, said third transistor having a collector-base junction, the collector electrodes of said third and fourth transistors being respectively connected to the emitter electrode of said fourth transistor and to said point of operating potential;
 means connecting said potential-offsetting means between the emitter electrode of said third transistor and the base electrode of said fourth transistor for maintaining said fixed offset potential between the emitter electrode of said third transistor and the base electrode of said fourth transistor; and
 a second auxiliary semiconductor junction similar in profile and area to the collector-base junction of said third transistor, said second auxiliary semiconductor junction being arranged with respect to the collector-base junction of said third transistor to be similarly exposed to transient ionizing radiation and connected in a second inverse-parallel connection with the collector-base junction of said third transistor.

* * * * *